United States Patent
Javid et al.

(10) Patent No.: US 9,792,392 B2
(45) Date of Patent: Oct. 17, 2017

(54) METHOD FOR DETERMINING THE SIZING OF THE TRANSISTORS OF AN ANALOG CIRCUIT

(71) Applicants: Centre National de la Recherche Scientifique—CNRS, Paris (FR); Universite Pierre et Marie Curie (Paris 6), Paris (FR)

(72) Inventors: Farakh Javid, Levallois (FR); Ramy Iskander, Paris (FR); Marie-Minerve Louerat, Paris (FR)

(73) Assignees: CENTRE NATIONAL DE LA RECHERCHE SCIENTIFIQUE—CNRS, Paris (FR); UNIVERSITE PIERRE ET MARIE CURIE (PARIS 6), Paris (FR)

( * ) Notice: Subject to any disclaimer, the term of this patent is extended or adjusted under 35 U.S.C. 154(b) by 0 days.

(21) Appl. No.: 14/915,049

(22) PCT Filed: Jul. 28, 2014

(86) PCT No.: PCT/FR2014/051956
§ 371 (c)(1),
(2) Date: Feb. 26, 2016

(87) PCT Pub. No.: WO2015/036667
PCT Pub. Date: Mar. 19, 2015

(65) Prior Publication Data
US 2016/0224700 A1   Aug. 4, 2016

(30) Foreign Application Priority Data
Sep. 13, 2013  (FR) .................................... 13 58839

(51) Int. Cl.
*G06F 17/50* (2006.01)

(52) U.S. Cl.
CPC ...... *G06F 17/5009* (2013.01); *G06F 17/5063* (2013.01)

(58) Field of Classification Search
CPC ......... H01L 21/266; H01L 2224/49171; H01L 22/00; H01L 24/48; H01L 24/49;
(Continued)

(56) References Cited

U.S. PATENT DOCUMENTS

| | | | | |
|---|---|---|---|---|
| 2008/0134109 A1* | 6/2008 | Hammouda | ........ | G06F 17/5063 716/113 |
| 2009/0307638 A1* | 12/2009 | McConaghy | ....... | G06F 17/5063 716/104 |
| 2014/0306238 A1* | 10/2014 | Taniguchi | ......... | H01L 23/49562 257/76 |

OTHER PUBLICATIONS

Article, Iskander et al., "Hierarchical sizing and biasing of analog firm intellectual properties", Integration, the VLSI Journal, vol. 46, No. 2, Mar. 1, 2013, pp. 172-188, NPL Reference: XP055132567, ISSN: 0167-9260, DOI: 10.1016/j.vlsi.2012.01.001.
(Continued)

*Primary Examiner* — Binh Tat
(74) *Attorney, Agent, or Firm* — Brinks Gilson & Lione; G. Peter Nichols (57) ABSTRACT

A method for determining electrical parameter values of the transistors of an analog circuit of a system on chip includes breaking the circuit down into a set of blocks connected to one another; establishing the wiring diagram of said circuit; defining a set of electrical constraints that are specific to said circuit, blocks and transistors of each block; defining electrical parameters of the circuit, block and transistors; selecting for each transistor of the circuit an operator for calculating the electrical parameter values of said transistor; generating structured diagrams of each block of the circuit from the defined constraints and the chosen operators; assembling said structured diagrams of blocks into a general
(Continued)

diagram of the circuit; identifying whether there is any conflict; and, if so, emitting an alarm signal.

12 Claims, 6 Drawing Sheets

(58) Field of Classification Search
CPC .............. H01L 27/0207; H01L 27/0688; G06F 17/505; G06F 9/5072; G06F 17/5036; G06F 17/5022; G06F 17/5045; G06F 17/5054; G06F 1/206
USPC .................................................. 716/100–108
See application file for complete search history.

(56) References Cited

OTHER PUBLICATIONS

Ph.D. Thesis, Iskander, University of Paris IV, Knowledge-Aware Synthesis for Analog Integrated Circuit Design and Reuse, (Connaissance et Synthese en vue de la Conception et la Reutilisation De Circuits Analogiques Integres), RésuméÉtendu, Jan. 1, 2008, Date of Defense: Jul. 2, 2008, pp. xxi-xliv, NPL Reference: XP055132662, Retrieved from the Internet: URL:tel.archives-ouvertes.fr/docs/00/81/21/08/PDF/thesis_ramy_iskander.pdf [retrieved on Jul. 31, 2014].
PCT/FR2014/051956 International Search Report dated Oct. 27, 2014 (4 pages).
PCT/FR2014/051956 Written Opinion of the International Search Authority dated Oct. 27, 2014 (7 pages).

* cited by examiner

METHOD FOR DETERMINING THE SIZING OF THE TRANSISTORS OF AN ANALOG CIRCUIT

This application claims priority to International Application No. PCT/FR2014/051956 filed Jul. 28, 2014 and to French Application No. 1358839 filed Sep. 13, 2013; the entire contents of each are incorporated herein by reference.

The present invention relates to the field of systems-on-chips, or SoCs, and more precisely to the structured design of the analog IP blocks integrated in an SoC, where the IP blocks ("IP" for Intellectual Property) are pre-characterized blocks arranged particularly to carry out one or more given functions.

Systems-on-chips, hereafter "SoCs" for brevity or equally well "circuits", are generally fabricated in CMOS technology (Complementary Metal Oxide Semiconductor, a technology for fabricating electronic components) and typically comprise a digital part and an analog part. The digital IP blocks are well managed nowadays and are not further discussed here. However, the analog IP blocks, which generally have amplification, filtering or analog <-> digital conversion functions, are generally very difficult to take into account during the design of an SoC. For brevity, and unless otherwise indicated, in the text which follows a "block" is intended to mean an analog IP block.

For a block, there is currently no general method or synthesis tools making it possible to provide a behavioral description of said block, more commonly referred to as a "netlist", on the basis of library of pre-characterized standard cells.

To date, for a given function or behavior (amplification, filtering, conversion), the analog synthesis is essentially broken down into the following three phases:
1. finding a suitable structure for the given function;
2. determining the value of the parameters of the structure adopted by the designer in order to comply with particular electrical specifications (for example the widths—denoted as W—of the transistors, and the biases of certain points of the circuit need to be calculated); and
3. patterning the masks of the adopted structure.

For the sizing phase, an optimizer and a performance evaluator which interact in a loop are generally used.

The automated synthesis of analog circuits is typically classified in the following two categories:
 simulation-based optimization and
 knowledge-based optimization.

Category A (simulation) offers the advantage of using complex standard models installed in a simulator. The drawback, however, is the need to launch the simulator numerous times, which involves a substantial synthesis time (several hours for a circuit with about one hundred transistors).

For category B (knowledge), everything depends on the designer. Modelling of the circuit by equations is a relatively time-consuming task which depends on several factors. The relationships between the performance of the circuit and the dimensions of the transistors are complex, and the analysis time may extend up to several months. The advantage, however, is that the synthesis becomes very fast because simulations are avoided.

Whatever the synthesis category, the use of an optimizer can lead to solutions which have drawbacks.

The object of the present invention is to combine the advantages of the two categories above.

More precisely, the invention relates to a method for determining the values of electrical parameters of the transistors of an analog circuit of a system-on-chip, comprising steps consisting in:

(100) breaking the circuit down into a set of blocks, at least some of which are connected to one another, each block having a defined functionality and comprising an arrangement of transistors which is specific to said block;

(110) establishing the circuit diagram of the circuit comprising said blocks;

(120) defining a set of electrical constraints specific to said circuit, to said blocks and to the transistors of each block, in particular as a function of the circuit diagram of the circuit;

(130) defining electrical circuit parameters, electrical block parameters and electrical transistor parameters;

(140) for each transistor of the circuit, selecting an operator for calculating the values of electrical parameters of said transistor, each calculation operator making it possible, for a given transistor, to calculate the values of output electrical parameters as a function of said operator, input electrical parameters and electrical constraints applied to said transistor;

(150) generating structured graphs of each block of the circuit on the basis of the defined constraints and the selected operators, each graph comprising a set of nodes;

(151) assembling these structured graphs of blocks to form an overall graph of the circuit by using the equipotentials of said circuit;

(160) identifying whether at least one of the nodes has a conflict; and (170) emitting an alarm signal if there is a conflict.

Preferably, said overall structured graph comprises all the calculation operators and constraints defined by the designer.

A step (171) of graphical representation of the alarm signal may be provided, in which, in the structured graph of the circuit, at least one of the elements among the block, the operator and the electrical parameter of said operator giving rise to the conflict are represented in a predetermined color.

Provision may be made that the step (160) of identifying a conflict comprises a step (161) consisting, for a given electrical parameter, in counting the number of electrical parameters whose value propagates to said given electrical parameter, and wherein the alarm signal is emitted (170) if said input or output parameter of an operator is defined by more than one other electrical parameter.

Steps may be provided consisting in:
(101) defining, for at least one block, a set of at least one reference transistor and a set of at least one corresponding secondary transistor, and
(152) propagating to the set of secondary transistors the values of the electrical parameters calculated for the corresponding reference transistor.

Preferably, if there is a conflict on an input electrical parameter value of an operator, the method comprises a step (162) consisting in eliminating the value of the block parameter giving rise to the conflict from the defined electrical constraints.

Preferably, if there is a conflict on an output electrical parameter value of an operator, the method comprises a step (163) consisting in replacing the selected operator whose output parameter is in conflict with a replacement operator such that the output parameter of the operator giving rise to the conflict is an input parameter of the replacement operator.

An evaluation step (180) consisting in calculating the quiescent point of the analog circuit may be provided.

A step (190) consisting in simulating the behavior of said circuit may be provided.

According to another of its objects, the invention relates to a computer program comprising program code instructions for carrying out the method according to the invention when it is run on a computer.

The quiescent point of a transistor is defined by all the electrical quantities characterizing said transistor in the absence of signals to be amplified. The quiescent point is therefore the status of the operating point of the transistor in the absence of any working signal. The bias of the transistor makes it possible to place its quiescent point at a desired value on its load line.

The bias point of a circuit lies at the intersection of the load lines in the static regime and in the dynamic regime, which make it possible to study the behavior of the circuit.

The present invention makes it possible to calculate automatically the bias point of an analog circuit and to calculate the dimensions of the transistors constituting the analog IP blocks of a given SoC. Furthermore, these calculations are carried out while complying with the assumptions and the knowledge of the designer of the SoC.

The present invention makes it possible to generate and test a plurality of calculation procedures for a same analog IP block, which a designer can very easily debug, which furthermore makes it possible to explore possibly a plurality of design scenarios of a same IP block.

The present invention also makes it possible to manage the design conflicts of a given IP block, such as the design conflicts of assembling the IP blocks with one another, which is particularly advantageous in the case of collaborative work, for example.

The present invention allows a standard hierarchical representation for the design and verification of an SoC comprising analog IP blocks. This representation can be shared easily and reused within a group of analog IP block developers in order to correct, evaluate and protect the knowledge associated with a given IP block.

Advantageously, the invention is independent of the fabrication technology of the SoC. It can therefore be used to design and redesign an analog IP block for different technologies very easily.

The present invention makes it possible to increase the design speed of analog IP blocks.

Further to assisting design, the present invention also makes it possible to simulate the static and transient (dynamic) behavior of the IP blocks. This structured simulation makes it possible to verify the electrical behavior of an IP block designed according to the invention.

Other characteristics and advantages of the present invention will become clearer on reading the following description, which is given by way of illustrative and non-limiting example, and is provided with reference to the appended figures, in which.

The present invention is placed in the context in which a designer wishes to design an SoC. On the basis of the constraints notably connected with the topology of the circuit and the design assumptions of the designer, it makes it possible to calculate automatically a reduced, or even minimum, number of electrical parameters of the transistors and their dimensions which are necessary for calculating the bias point of the circuit.

Circuit Diagram

A step 110 is provided, consisting in establishing the circuit diagram of the circuit, for example by using a software for designing circuit diagrams on a computer.

The establishment of the circuit diagram is preceded by a step consisting in defining the topology of the circuit, that is to say in breaking down 100 the overall circuit according to hierarchical levels into a set of sub circuits or blocks which are connected to one another, and in defining the arrangement of the transistors in each sub circuit, each block having a defined functionality.

Provision 130 is made to define electrical circuit parameters, electrical block parameters and electrical transistor parameters.

In a block, a plurality of transistors may be assembled to form an elementary device, for example a current mirror, composed of a small number of interconnected transistors, among which a reference transistor and secondary transistors are defined. The reference transistor controls the sizing and the bias of the other transistors within the elementary device. In a manner known per se, this is because the electrical parameters of a reference transistor uniquely define those of the secondary transistors by propagation of the parameters from said reference transistor to the secondary transistors.

Provision 101 may be made to define, for at least one block, a set of at least one reference transistor and a set of at least one corresponding secondary transistor.

The propagation property is advantageously used in the structured graphs described below, in which only the reference transistors are represented, which makes it possible to increase the calculation speed. Each transistor or each elementary device may be selected by the designer from a library of components.

Provision 152 may be made to propagate to the set of secondary transistors the values of the electrical parameters calculated for the corresponding reference transistor.

Figure 1:
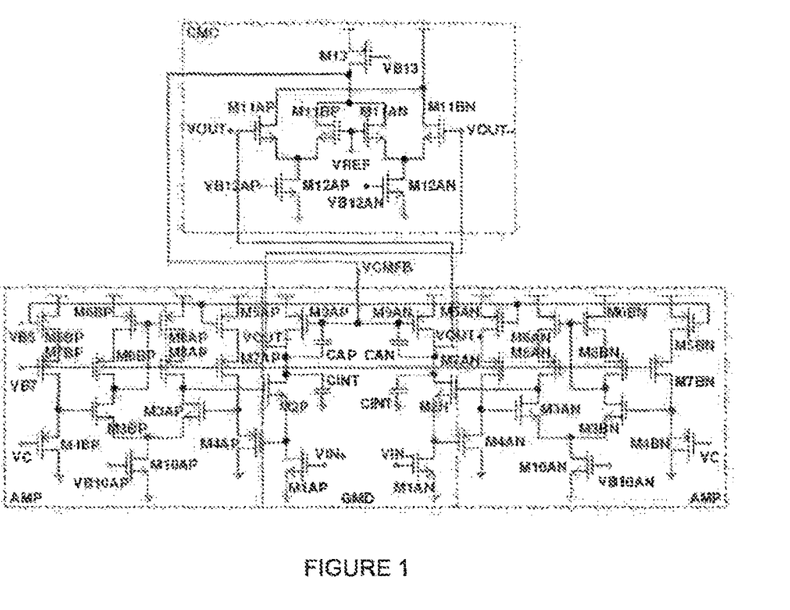
FIG. 1 illustrates an embodiment of a circuit diagram of an analog circuit.

By way of example in FIG. 1, an overall circuit has been illustrated which performs a function of controlling the linear trans conductance of the block GMD with the voltage Vc, by controlling the drains of the transistors M1AP and M1AN differentially, the trans conductance being the ratio between the variation of the output current and the variation of the input voltage of a component or of a circuit. For brevity, this circuit is used as the single example of a circuit for the present invention. This circuit comprises 4 blocks or sub circuits CMC, AMP, GMD and AMP represented in dashes. Each of these blocks performs a given function. In this case, the block GMD is the core of the differential trans conductance, the blocks AMP allow frequency tuning, and CMC is a feedback sub circuit for stabilizing the operating point.

The two blocks AMP are identical and consequently have the same reference (see the matching constraints below); they are electrically connected only to the block GMD. The block CMC is electrically connected only to the block GMD.

The circuit diagram of the circuit makes it possible to define at least some of the constraints thereof.

Definition of the Constraints

Once the circuit diagram of the circuit is completed, provision 120 is made to define a set of electrical constraints at each hierarchical level of the circuit: for the overall circuit, the blocks, and the components (transistors or elementary devices) of the blocks.

The constraints may depend on the intended use of the circuit. They comprise, for example, at least one of the following elements: the supply voltage, the electrical connections (for example the equipotentials), the matching of certain components, and the assumptions of the designer. The assumptions or constraints of the designer are constraints which cannot be extracted from the circuit diagram of a circuit. These are, for example, the scheduling of the transistors, the linear constraints (see below) or the selection of the operators (described below). At least some of the assumptions of the designer may be modified, while other constraints (typically the supply voltage) cannot be modified by the designer.

For the constraints relating to the blocks and to the components, provision is made to define at least some, and preferably all, of the electrical constraints over all the blocks and the transistors of the circuit.

Typically, there are the linear electrical constraints, matching constraints, scheduling constraints, and the sizing and bias constraints.

The linear constraints make it possible to express the linear dependencies between parameters.

The linear constraints are inherent to the topology of the circuit, for example because of Kirchhoff's laws (nodal rule and mesh rule), or inherent to the circuit, for example via the equipotentials (with or without electrical connection) or via the reference bias current values received by each transistor (each transistor receives either the value of the reference bias current or a multiple of this value). They can therefore be defined as a function of the circuit diagram of the circuit or as a function of a design selection.

The matching constraints make it possible to consider blocks fulfilling the same given function, for example amplification, filtering or conversion, as equivalent.

The matching constraints make it possible to consider that the reference transistor of a block is identical to the equivalent transistor in a matched block, that is to say one with the same width. In each matched block, a reference transistor is defined. The calculation of the dimensions of the reference transistor is applied to the matched transistor.

By way of example in FIG. 1, the two blocks AMP are matched, the dimensions of their reference transistors are the same. Consequently, only the dimensions of the transistors of one of the blocks are calculated, and only one of the blocks AMP may be used in the structured graph described below.

The scheduling constraints define the order in which the transistors are designed.

The scheduling constraints are based on the circuit diagram of the circuit; they make it possible to define the order in which the transistors of a block are dimensioned.

Advantageously, this order is represented graphically by structured graphs, which are described below. Such graphs have been published in the reference F. Javid, R. Iskander, M-M Louërat and D. Dupuis "Analog Circuits Sizing Using Bipartite Graphs", IEEE, Midwest Symposium on Circuits and Systems, August 2011.

The sizing and bias constraints correspond to the selection by the designer of a given operator for each transistor, the operator making it possible to calculate the electrical parameters of the corresponding transistor.

An electrical parameter of a transistor is intended, in particular, to mean its dimensions (width and length) as well as at least some of its electrical voltages (gate, drain and source voltage).

Operators

Provision 140 is made to select a set of operators; each operator corresponds to a given transistor and makes it possible to calculate electrical parameters of said transistor as a function of the type of operator selected and certain input electrical parameters.

Operators are known, for example from the publication R. Iskander, M-M Louërat, A. Kaiser "Hierarchical Sizing and Biasing of Analog Firm Intellectual Properties", Integration, the VLSI Journal, March 2013—pp. 172-188; Vol 46, issue 2 in press, DOI 10.1016/j.vsli.2012.01.001; or from the publication F. Javid, R. Iskander, M-M Louërat "Simulation-Based Hierarchical Sizing and Biasing of Analog Firm IPs", IEEE International Behavioral Modeling and Simulation Conference, pages 43-48, September 2009. On the basis of the circuit diagram of the circuit (FIG. 1), they make it possible to calculate parameters of a given transistor, for example the gate, drain or source voltages at any particular point of the circuit, and the width of the corresponding transistor.

For example, for the transistor M6BP (FIG. 1), the source voltage is connected with the supply voltage, which is known. The gate voltage may be determined by an operator, for example the operator OPVG which makes it possible to determine this gate voltage in addition to the width of the transistor. Knowledge of the gate voltage makes it possible to calculate the source voltage. Conversely, the designer may choose to determine the source voltage by an operator, in this case OPVS, and then to calculate the gate voltage as a function of the source voltage.

Each operator calculates output electrical parameters on the basis of input electrical parameters and of the type of operator.

Figure 2:
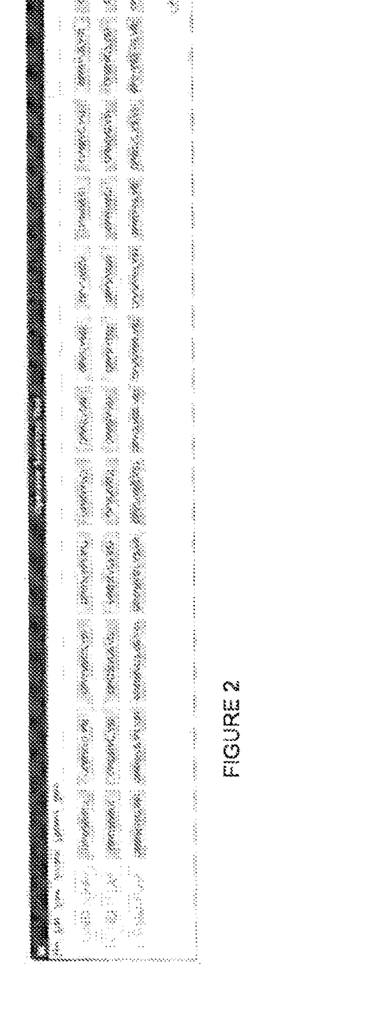
FIG. 2 illustrates an embodiment of a set of operators which are possible according to the invention for the 3 reference transistors M9AP, M1AP and M2P of the block GMD of the circuit of FIG. 1.

In FIG. 2, for each row, a set of possible operators for each reference transistor of the block GMD, in this case M9AP, M1AP and M2P, of FIG. 1, is illustrated. It is presented in software form.

The selection by a designer of a given operator for a given reference transistor subsequently makes it possible to calculate the corresponding dimensions of said reference transistor and to propagate these values to the secondary transistors of the elementary device to which said reference transistor belongs.

To this end, once the circuit diagram has been produced and the constraints of the circuit have been determined, provision is made to produce a structured graph corresponding to the selected operators.

Structured Hierarchical Block Graph

Provision 150 is made to produce a structured graph corresponding to the selected operators for all the blocks of a given circuit. In this case, it is a graphical representation in the form of a dependence graph, the nodes of which represent the electrical parameters of the transistors, the operators and the constraints. The arcs represent the propagation of the electrical parameters in the graph.

The structured block graphs are subsequently assembled 151 to form an overall graph of the circuit by using the equipotentials of said circuit.

Figure 3:
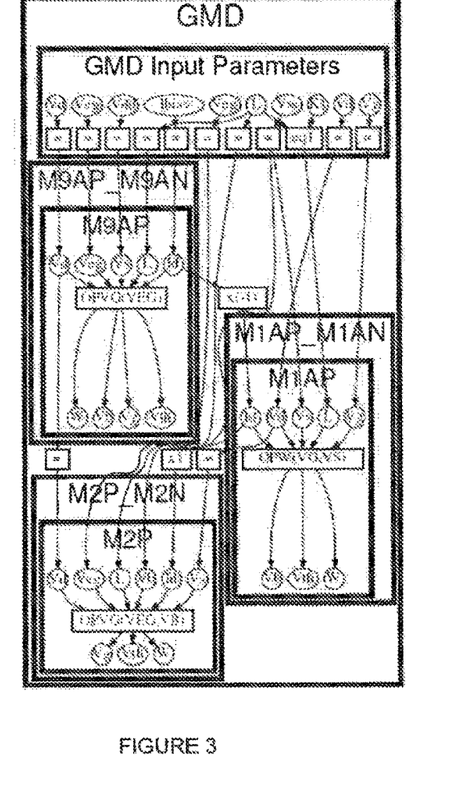
FIG. 3 illustrates an embodiment according to the invention of a structured graph for the block GMD of the circuit of FIG. 1.

A simplified example of a structured hierarchical graph is illustrated in FIG. 3, which represents an embodiment of a structured hierarchical graph for the block GMD of the circuit in FIG. 1.

In this case the block GMD is symmetrical so that the transistors M9AP, M2P and M1AP are defined as reference transistors for respectively calculating the parameters of the secondary transistors M9AN, M2N and M1AN.

The block is represented in a predetermined shape, in this case a rectangle, comprising in the header the identification of said block, in this case GMD.

Each transistor is represented in a predetermined shape, in this case a rectangle, comprising in the header the identification of said transistor, for example M1AP. The matching between transistors is also represented by a predetermined shape, in this case a rectangle, comprising in the header the identification of said transistors connected to one another by a predetermined symbol, in this case the symbol "_". For example, the matching between the transistor M9AP and the transistor M9AN is represented by M9AP_M9AN, and likewise for M1AP_M1AN or M2P_M2N.

The input and output electrical parameters of an operator for a given transistor are represented by a predetermined shape, in this case circles or ellipses, each circle or ellipse comprising a single parameter, the label of which illustrates said parameter, for example Vd for the drain voltage, L for the width, Vg for the gate voltage, W for the width, Id for the drain terminal current, Vs for the source voltage, L for the length.

The parameters representing the constraints of said block are arranged, by convention, at the top of the structured graph and arranged in a predetermined shape, in this case a rectangle, and are identified as block constraints, in this case by the header "GMD Input Parameters".

Some electrical parameters are connected to one another by arrows. For a given operator, the direction of the arrows between the parameters and said operator indicates whether the parameters are input parameters or output parameters. Two electrical parameters may be connected to one another by means of a mathematical function representing the associated constraints. The mathematical function is illustrated in a predetermined shape, in this case a square, comprising a symbol of said mathematical function.

Figure 4:
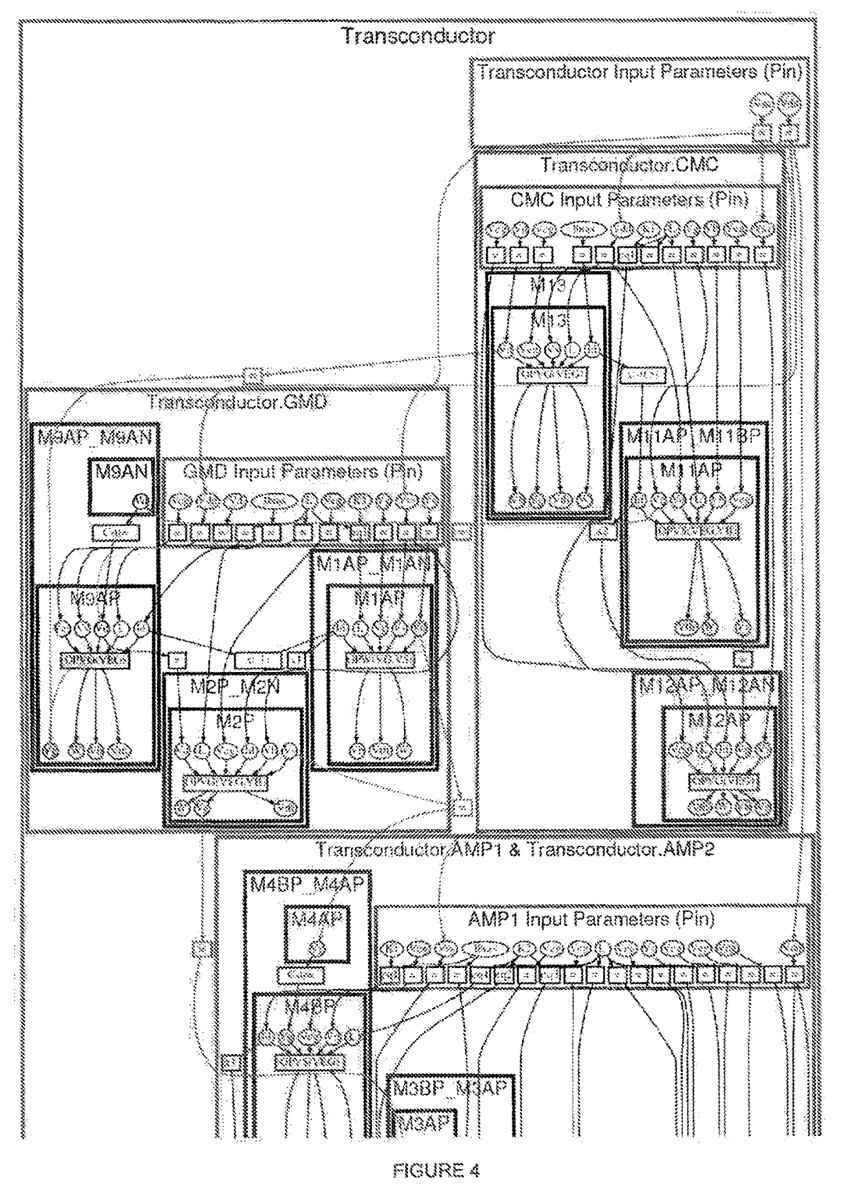
FIG. 4 illustrates an embodiment according to the invention of a truncated structured graph for the circuit of FIG. 1 when it has a conflict.

The rectangles marked, for example, "eq1", "eq2", etc., or more generally "eqN", represent the constraints established by the designer. For example, the equation "eq1" lying in the rectangle "GMD Input Parameters" of FIG. 3, 4 or in the rectangle "AMP1 Input Parameters (Pin)" of FIG. 4 is defined by:

$$L\_M1AP = L*K1 \qquad \text{eq1:}$$

where L_M1AP is the length of the transistor M1AP of FIG. 1, L and K1 are two parameters defined by the designer.

The rectangles marked "×1", "×(−1)", or more generally "×N" correspond to functions of multiplication by a factor N, which make it possible to establish relationships between the currents of the transistors of the circuit. For example, the node labeled "×(−1)" in FIG. 3 represents the following equation:

$$Id\_M1AP = Id\_M9AP*(-1)$$

where Id_M1AP and Id_M9AP are respectively the currents of the transistors M1AP and M9AP of FIG. 1.

Lastly, the rectangles marked "=" express the equality of two (or more) parameters. The equipotentials (i.e. electrical connections) of the circuit are represented by such rectangles.

For example, the value of the bias current Ibias is equal to the value of the current Id of the transistor M9AP. This value of the current Id is an input parameter of the operator OPVG(VEG) of said transistor M9AP. In parallel, this value of the current Id of the transistor M9AP is multiplied by the mathematical function (−1) as the value of the input parameter Id of the operator OPW(VG,VS) of the transistor M1AP.

More generally, the arrows correspond to the constraints and illustrate the propagation of the value of a parameter. They are generated automatically. They may connect the parameters of a transistor:
to another transistor of the same block,
to the constraints of the block to the parameters of another block.

The values of the input electrical parameters are known because they are set or depend on a preceding calculation result. For example:
the value Vg of the transistor M1AP is set; in this case, it is equal to the value Vg defined by the constraints of the block GMD in the rectangle "GMD Input Parameters", which represents the constraints set by the designer for the block GMD;
the value Id of the transistor M1AP is calculated on the basis of the value Id of the transistor M9AP, of which it is multiplied by (−1).

The values of the output electrical parameters are calculated by an operator. For example, the output parameters of the operator OPW(VG, VS) for the transistor M1AP are Vb (for ground or bulk voltage), Vth (for threshold voltage) et W (for width). The values of these output parameters are calculated by said operator as a function of the values of the input parameters.

Each operator is represented in a predetermined shape, in this case a rectangle, comprising in the header the identification of said operator, for example OPW(VG,VS) for the transistor M1AP (FIG. 3).

All the operators are configured in order to calculate at least the width W of the corresponding transistor as an output parameter. Preferably, all the operators are furthermore configured in order to calculate at least the threshold voltage Vth of the corresponding transistor as an output parameter. The calculation of the bulk voltage Vb, the gate voltage Vg or the source voltage Vs typically depends on the operator selected.

Of course, shapes other than squares, rectangles and circles may be selected.

The graphical arrangement of the transistors with respect to one another complies with the scheduling constraints. By convention, it is defined that the structured graph is read from top to bottom. In this case, the transistor M9AP is therefore created before the transistor M1AP, which is itself created before the transistor M2P.

For a given block, the design order of the transistors may be defined as a function of the circuit diagram of the circuit. Preferably, the transistors are produced by branches, where a branch is the set of transistors connected to one another by their sources or their drains. Preferably, for a given branch, the transistors are produced according to a determined sequence.

For example, in FIG. 1, a production sequence for the first branch on the left of the left block AMP is as follows:

transistor M5BP then transistor M7BP, then transistor M4BP. This linear order is not obligatory, and more complex embodiments may be provided in which the sequence is different: transistor M5BP then transistor M4BP, then transistor M7BP.

The advantage of a production sequence, and therefore of a design sequence, is that some parameters of the transistors can propagate along the sequence in a given branch. For example, in the upper-left part of the block AMP of FIG. 1, the voltage VC makes it possible to calculate the voltage VB7, which makes it possible to calculate the voltage VB5.

For example, the branch of the transistors M9AP, M2P and M1AP of the block GMD of FIG. 1 corresponds to the sequence of transistors M9AP, M1AP and M2P of FIG. 3.

Structured Hierarchical Circuit Graph

The constraints defined by the designer for each block may lead to design conflicts when the blocks are assembled with one another.

Generalizing the preceding example of a structured graph for the block GMD, once the circuit diagram of the circuit has been defined, the constraints have been defined and the operators have been selected, provision is made to produce a structured hierarchical graph for all the blocks of said circuit. Preferably, the graph comprises all the hierarchical levels: the circuit, the blocks of the circuit, and the transistors of each block.

For example, FIG. 4 illustrates a structured hierarchical graph of the circuit of FIG. 1 in a truncated fashion for better readability.

The graph is structured in that each block and each transistor is clearly identified. It is hierarchical in that there is a reading convention making it possible to order the calculation of the parameters of the transistors block by block. The position of the blocks is determined by the designer, and it defines the design order of the sub circuits in the reading direction of the graph. Lastly, the graph is bipartite in that it contains two types of nodes: the parameters (represented by circles) and the equations (represented by rectangles). The graph makes it possible to illustrate easily the possible conflicts in a first evaluation phase and their solution in a second phase.

A first step consists in obtaining the corresponding graph of each block of the circuit, then a second step consists in obtaining the graph corresponding to the circuit.

For example, with reference to FIG. 1, the circuit comprises three blocks (since the two blocks AMP are matched). These three blocks are illustrated in FIG. 4. Being a trans conductance control circuit, the blocks CMC and GMD are respectively identified by Transconductor.CMC and Transconductor.GMD. Since the two blocks AMP are matched, the two blocks AMP are identified by Transconductor.AMP1 and Transconductor.AMP2.

Once the graph is constructed, it is evaluated. This evaluation makes it possible, by virtue of the circuit diagram of the circuit, the defined constraints and according to the reading convention, to calculate the output electrical parameters of all the operators of the transistors of the entire circuit. The terms evaluation, reading or execution of the graph, in this case by a software, are used equivalently.

This evaluation makes it possible to generate the calculation of the dimensions of the components, the hitherto unknown voltages of the connectors, as well as all the parameters of all the transistors of the circuit, by virtue of the selected operators and the defined constraints.

Design Conflicts Between the Blocks

In the graph, there may be conflicts involving parameters connecting two blocks.

Provision 160 is made to identify the possible conflicts, which may make it possible to make the graph still evaluable.

The identification of a conflict may comprise a step 161 consisting in, for a given electrical parameter, counting the number of electrical parameters whose value propagates to said given electrical parameter.

FIG. 4 illustrates a truncated structured graph corresponding to the circuit of FIG. 1 and for which block constraints have been defined by the designer in the rectangles "Input Parameters (Pin)" for each block CMC, GMD and AMP; and operators have been selected for each reference transistor of each block.

The output parameters of each operator are calculated as a function of the constraints defined as input parameters of the various operators and the selection of the operators. The value of an output parameter of an operator may be reused (propagated) as an input parameter for another operator in the reading direction of the structured graph.

For example, in FIG. 4, the first constraints defined are those of the overall circuit "Transconductor Input Parameters (Pin)", then those of the block CMC ("CMC Input Parameters (Pin)"), some of which are used as input parameters of the operator OPVG(VEG) of the transistor M13.

For example, the value Vd propagates from the constraints of the block CMC to the transistor M13 as an input parameter of the operator OPVG(VEG). This value Vd then propagates with an equality constraint as an output parameter Vg of the operator OPVG(VEG) of the transistor M9AP of the block GMD, etc. Since this value Vg is also defined as an output parameter calculated by the operator OPVG(VEG) of the transistor M9AP, there is therefore a conflict since this value Vg is non-uniquely defined.

In the event of conflict, provision 170 is made to produce an alarm indicating this conflict. For example, provision may be made to emit a message whose content indicates the existence of a conflict. Preferably, provision is made for the content of the message to identify at least the operator and the electrical parameter giving rise to the conflict. As an alternative or in combination, a graphical representation of the alarm may be provided 171, for example by a color code. In this case, at least one of the elements among the block, the operator and the electrical parameter of said operator giving rise to the conflict are colored, for example in red. The designer can thus find the design conflicts very easily and very rapidly.

Figure 5:
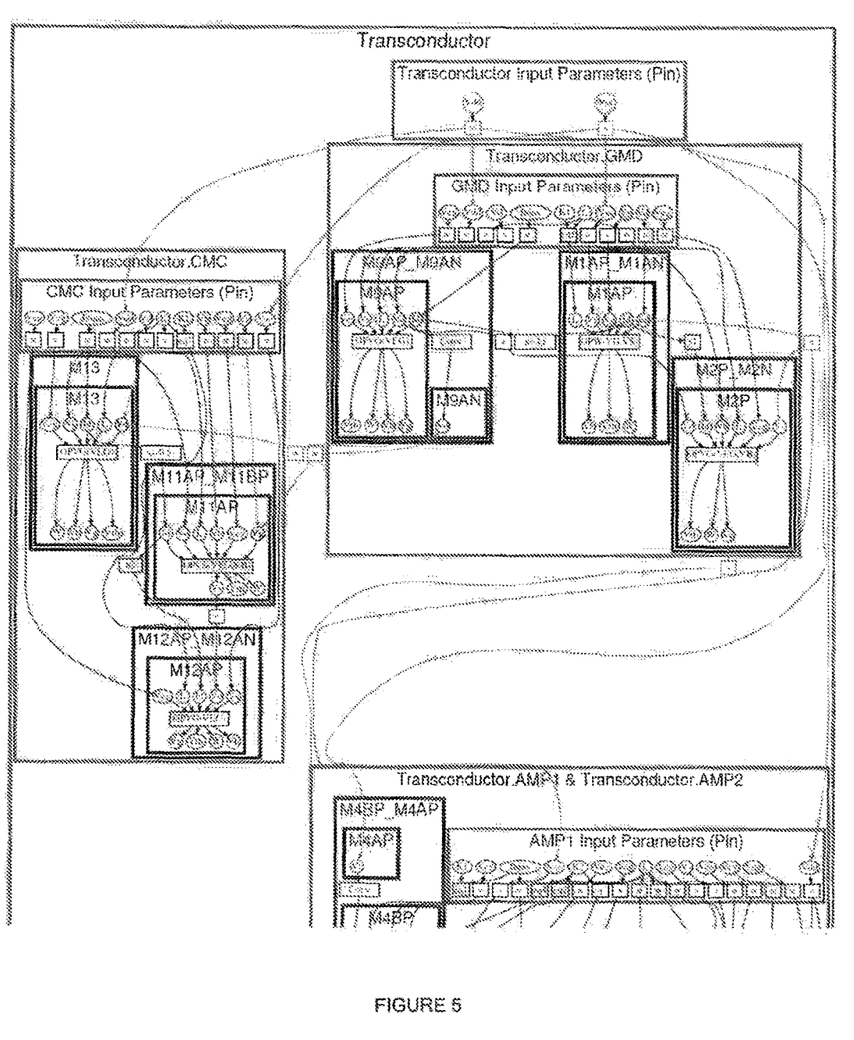
FIG. 5 illustrates in a truncated fashion the graph of FIG. 4 when generated according to a different design selection, leading to other conflicts.

Another example of a conflict is illustrated in FIG. 5, which illustrates another embodiment of a structured graph of the circuit of FIG. 1 in a truncated fashion. In this case, the design order of the sub circuits is different to FIG. 4, which may generate different conflicts.

In FIG. 5, the value Vg of the input parameter of the operator OPVS(VEG, VB) of the transistor M11AP of the block CMC is defined both by the value Vg of the constraints of the block "CMC Input Parameters (Pin)" of said block and by the value Vd of the output parameter of the transistor M9AN of the block GMD. There is therefore a conflict. Likewise, the value Vd of the input parameter of the operator OPVG(VEG) of the transistor M13 of the block CMC is defined both by the value Vd of the constraints of the block "CMC Input Parameters (Pin)" of said block and by the value Vg of the output parameter of the transistor M9AP of the block GMD. There is therefore a conflict.

Essentially two types of conflict may exist, on output parameters or on input parameters.

Typically, since each input and output parameter must be defined as a function of a unique parameter preceding in the propagation direction, the identification of a conflict consists in detecting whether an input or output parameter of an operator is defined by more than one parameter, in which case an alarm will consequently be produced.

For example, provision is made to count, for a given parameter, the number of incident arcs, that is to say those which point toward or enter this parameter. This operation is repeated for all the parameters of the circuit.

Resolution of the Conflicts

As seen above, there is a conflict for example when the value of a parameter is defined by more than one equation.

On an input parameter, there may be a conflict between a block parameter and an output parameter, both of which propagate their value to the same input parameter.

In this case, provision 162 is made to eliminate one of the block or output parameters giving rise to the conflict. Preferably, provision is made to favor the physical reality of the circuit, that is to say to favor the constraint corresponding to the physical reality of the circuit. In general, the block constraints are defined by the designer and the constraints between blocks or between transistors of the same block are physical constraints. Preferably, provision is made to eliminate the parameter of the block constraint giving rise to the conflict.

For example, in FIG. 4 there is a conflict for the input value Vd of the operator OPVG(VEG) of the transistor M9AP of the block GMD since this value is defined both by the value Vd of the transistor M9AN and by the value Vd of the parameters of the block GMD.

Figure 6:
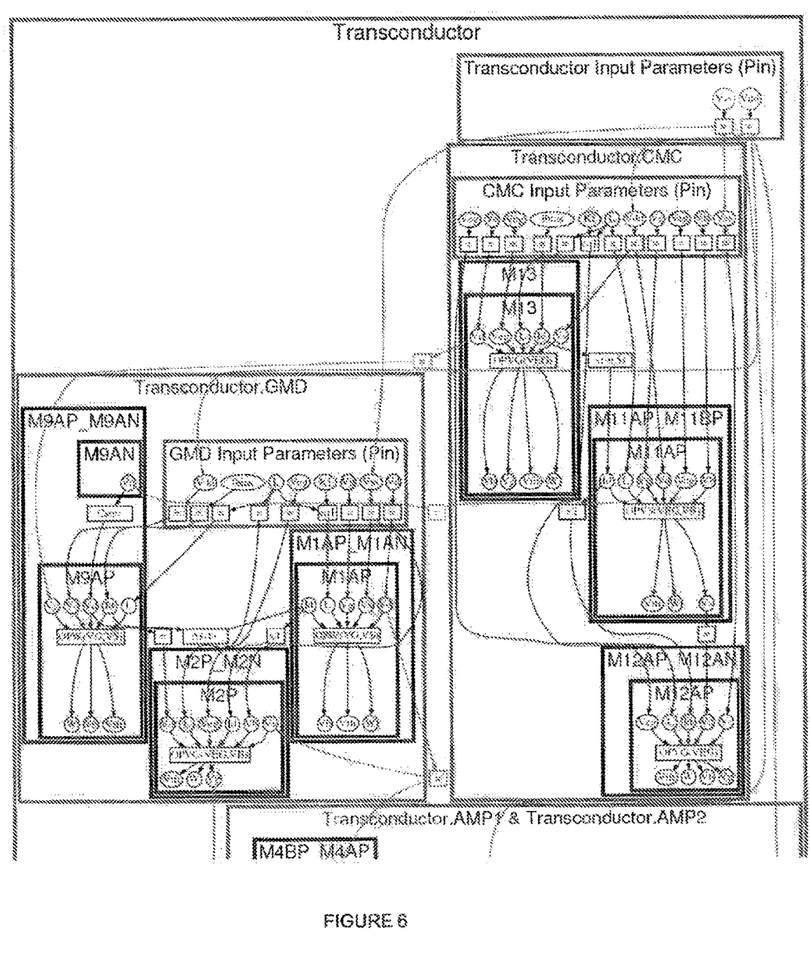
FIG. 6 illustrates in a truncated fashion a graph according to the invention which resolves the conflicts of the graph of FIG. 4.
Figure 7:
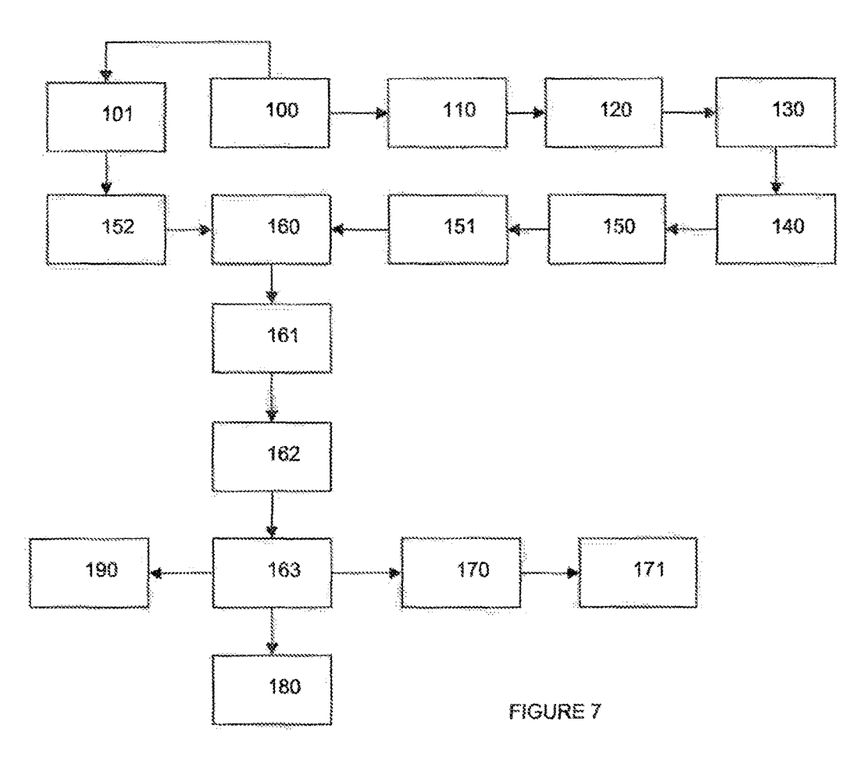
FIG. 7 illustrates an embodiment of the method according to the invention.

This conflict is resolved, as illustrated in FIG. 6, by favoring the physical reality of the circuit, that is to say by keeping the input value Vd of the operator OPVG(VEG) of the transistor M9AP of the block GMD as being defined by the value Vd of the transistor M9AN alone and by eliminating the value Vd of the parameters of the block GMD (GMD Input Parameters (Pin)).

In the event that a block parameter propagates its value to two parameters, only one of which generates a conflict, the operator associated with the conflict is changed in order to resolve the conflict, but the block parameter is kept so as to propagate to the parameter which does not generate the conflict.

On an output parameter, there may be a conflict between a parameter whose value would be calculated by two operators or by one operator and by the propagation of a value of another electrical parameter as a function of certain constraints.

In this case, provision 163 is for example made to replace the selected operator whose output parameter is in conflict with another operator, referred to as a replacement operator. Preferably, the replacement operator is an operator of the same class as that of the first operator, the class of an operator defining the voltages (gate, drain or source) calculated by it. For example, referring to FIG. 2, the operators OPIDS(VEG), OPIDS(VG, VS), OPIDS(VGS, VG) and OPIDS(VGS, VS) are of the same class. Likewise, the class of operators OPVG and that of the operators OPW are defined.

Advantageously, provision is made for the output parameter of the operator giving rise to the conflict to be an input parameter of the replacement operator.

For example, as illustrated in FIG. 4, the value Vg of the output parameter of the operator OPVG(VEG) of the transistor M9AP of the block GMD is in conflict because it is also defined by the value Vd of the transistor M13 of the block CMC.

In this case, the conflict is resolved, as illustrated in FIG. 6, by replacing the operator OPVG(VEG) of the transistor M9AP of the block GMD, an output parameter of which gives rise to the conflict, with a replacement operator, in this case the operator OPW(VG,VS), in which the value Vg is then an input parameter still defined by the value Vd of the transistor M13 of the block CMC. The propagation is thus kept and the conflict resolved.

A structured graph makes it possible to detect and resolve the conflicts. It may furthermore be reused subsequently for synthesis and redesign of the circuit.

Simulation

Figure 8:
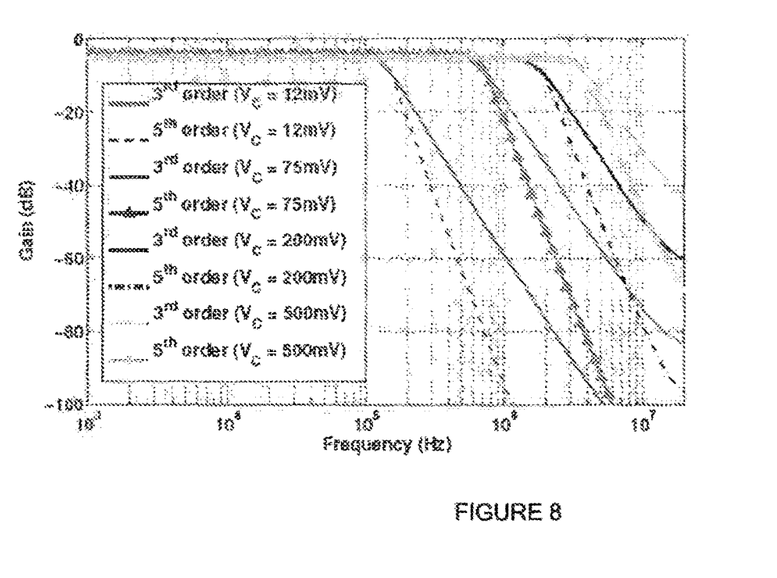
FIG. 8 illustrates the results of a simulation of 3rd and 5th order filters designed on the basis of the circuit of FIG. 1 by using the invention.

Once the conflicts have been resolved by virtue of the invention, by virtue of the structured graph of a given circuit, the DC (direct-current) behavior of said circuit may furthermore be simulated 190 with the aid of the values of the output parameters. FIG. 8 represents the variation in the gain of the $3^{rd}$ and $5^{th}$ order (filter) circuit designed on the basis of the circuit of FIG. 1, as a function of the frequency for four values of control voltage Vc.

The design of a circuit can thus be optimized.

The invention is a tool to assist the design of analog circuits, which makes it possible to calculate the dimensions of the transistors and which makes it possible to guide the designer in the design of an analog circuit.

The invention is independent of the number of blocks, and the number of electrical parameters. The number of operators is linear with the number of transistors, which allows very fast calculations.

Once the dimensions of the transistors have been calculated and the conflicts have been resolved, a step 180 consisting in calculating the quiescent point of the analog circuit is provided.

The use of an optimizer is not obligatory. Nevertheless, if an optimizer is used, the graph makes it possible to accelerate the optimization very greatly by acting in the manner of a filter which allows only the configurations which work.

Tests have been carried out by the applicant on the time needed for sizing the circuit illustrated in FIG. 1. According to the techniques of the prior art, this time is several hours; according to the invention, the time needed for reading and evaluating the structured graph representing the circuit in FIG. 1, and identification and resolution of the conflicts, is 64 seconds after optimization of the parameters.

The invention claimed is:

1. A method for determining, by using a computer, the values of electrical parameters of transistors of an analog circuit of a system-on-chip, comprising:
    breaking the circuit down into a set of blocks, at least some of which are connected to one another, each block having a defined functionality and comprising an arrangement of transistors which is specific to said block;
    establishing a circuit diagram of the circuit comprising said blocks;
    defining a set of electrical constraints specific to said circuit, to said blocks and to the transistors of each block, as a function of the circuit diagram of the circuit;
    defining electrical circuit parameters, electrical block parameters and electrical transistor parameters;
    for each transistor of the circuit, selecting an operator for calculating values of electrical parameters of said transistor, each calculation operator making it possible, for a given transistor, to calculate values of output electrical parameters as a function of said operator, input electrical parameters and electrical constraints applied to said transistor;

generating structured graphs of each block of the circuit on a basis of defined constraints and selected operators, each graph comprising a set of nodes;

assembling the structured graphs of blocks to form an overall graph of the circuit by using equipotentials of said circuit;

identifying whether at least one of the nodes has a conflict;

emitting an alarm signal if there is a conflict, wherein, if there is a conflict on an input electrical parameter value of an operator, the method comprises eliminating the value of the block parameter giving rise to the conflict from the defined electrical constraints and if there is a conflict on an output electrical parameter value of an operator, the method comprises replacing the selected operator whose output parameter is in conflict with a replacement operator such that the output parameter of the operator giving rise to the conflict is an input parameter of the replacement operator.

2. The method as claimed in claim 1, wherein said overall structured graph comprises all calculation operators and constraints defined by a designer.

3. The method as claimed in claim 2, comprising a step of graphical representation of the alarm signal, in which, in the structured graph of the circuit, at least one of the elements among the block, the operator and the electrical parameter of said operator giving rise to the conflict are represented in a predetermined color.

4. The method as claimed in claim 1, wherein the step of identifying a conflict comprises a step of, for a given electrical parameter, counting the number of electrical parameters whose value propagates to said given electrical parameter, and wherein the alarm signal is emitted if said input or output parameter of an operator is defined by more than one other electrical parameter.

5. The method as claimed in claim 1, comprising:
defining, for at least one block, a set of at least one reference transistor and a set of at least one corresponding secondary transistor, and
propagating to the set of secondary transistors the values of the electrical parameters calculated for the corresponding reference transistor.

6. The method as claimed in claim 1, comprising an evaluation step that includes calculating a quiescent point of the analog circuit.

7. The method as claimed in claim 1, comprising simulating behavior of said circuit.

8. The method as claimed in claim 1, wherein the alarm signal comprises a message whose content indicates existence of the conflict.

9. The method as claimed in claim 8, wherein the content of the message identifies at least the operator and the electrical parameter giving rise to the conflict.

10. The method as claimed in claim 3, wherein the alarm signal comprises a message whose content indicates existence of the conflict.

11. The method as claimed in claim 10, wherein the content of the message identifies at least the operator and the electrical parameter giving rise to the conflict.

12. A computer program comprising nontransitory program code instructions for carrying out the method as claimed in claim 1 when it is run on a computer.

* * * * *